United States Patent
Briano (10) Patent No.: US 10,074,939 B1
(45) Date of Patent: Sep. 11, 2018

(54) SIGNAL ISOLATOR HAVING INDUCTIVE AND CAPACITIVE SIGNAL COUPLING

(71) Applicant: Allegro MicroSystems, LLC, Worcester, MA (US)

(72) Inventor: Robert A. Briano, Hampton, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/671,357

(22) Filed: Aug. 8, 2017

(51) Int. Cl.
| | |
|---|---|
| H02M 1/14 | (2006.01) |
| H01R 13/658 | (2011.01) |
| H01L 23/00 | (2006.01) |
| H04B 3/56 | (2006.01) |
| H04L 25/02 | (2006.01) |
| H01L 23/485 | (2006.01) |
| H01L 23/66 | (2006.01) |

(52) U.S. Cl.
CPC ......... *H01R 13/658* (2013.01); *H01L 23/485* (2013.01); *H01L 23/66* (2013.01); *H01L 24/03* (2013.01); *H01L 24/49* (2013.01); *H04B 3/56* (2013.01); *H04L 25/0268* (2013.01)

(58) Field of Classification Search
CPC ..... H01R 13/658; H01L 23/485; H01L 23/66; H01L 24/03
USPC ............................................ 307/105; 365/20
See application file for complete search history.

(56) References Cited

U.S. PATENT DOCUMENTS

| | | | |
|---|---|---|---|
| 5,812,363 A | 9/1998 | Kuroda et al. | |
| 6,873,065 B2 | 3/2005 | Haigh et al. | |
| 8,169,108 B2* | 5/2012 | Dupuis | H04L 25/0268 307/109 |
| 8,643,138 B2 | 2/2014 | Dong | |
| 9,660,848 B2* | 5/2017 | Yun | H04L 27/04 |
| 2006/0263727 A1* | 11/2006 | Lee | H01L 23/3114 430/311 |
| 2008/0158777 A1 | 7/2008 | Sohn et al. | |
| 2012/0181874 A1* | 7/2012 | Willkofer | H01L 23/48 307/104 |
| 2013/0278077 A1* | 10/2013 | Mueck | H02J 1/02 307/105 |
| 2013/0335882 A1 | 12/2013 | Ma et al. | |
| 2016/0126367 A1* | 5/2016 | Dunton | H01L 31/02021 307/115 |

OTHER PUBLICATIONS

G. Knoedl, et al. "A Monolithic Signal Isolator"; Applied Power Electronics Conference and Exposition, 1989, Fourth Annual IEEE; pp. 165-170 (6 pages).
Daughton; "Spin-Dependent Sensors"; Proceedings of the IEEE, vol. 91, No. 5; pp. 681-686; May 5, 2003; 6 Pages.

* cited by examiner

*Primary Examiner* — Anthan Tran
(74) *Attorney, Agent, or Firm* — Daly, Crowley, Mofford & Durkee, LLP (57) ABSTRACT

Methods and apparatus for a signal isolator having inductive and capacitive coupling. In embodiments, magnetic and electric fields are coupled by coils and capacitive plates. In embodiments, a floating plate can enable a top and bottom capacitive plate to be offset from each other.

21 Claims, 8 Drawing Sheets

SIGNAL ISOLATOR HAVING INDUCTIVE AND CAPACITIVE SIGNAL COUPLING

BACKGROUND

As is known in the art, signal isolators can be used to transfer information across a barrier used to separate voltage domains for safety or functional isolation. For example, optocouplers include a LED that emits light through an optically transparent insulating film and strikes a photo detector that generates a current flow that corresponds to the emitted light. RF carriers can also be used to transmit information across an isolation barrier. Some conventional signal isolators are optimized for capacitive coupling and other conventional signal isolators are optimized for inductive coupling.

SUMMARY

The present invention provides method and apparatus for analog or digital signal isolators that utilize inductive and capacitive signal coupling to transmit a signal across an isolation barrier separating first and second discrete integrated circuit chips or isolated regions of a single chip. In embodiments, inductive coupling is created through coils making up a transformer built into layers of the coupler. The core of the transformer is composed of non-magnetic insulting layer creating the isolation barrier. The capacitive coupling is created through differential capacitors, whose dielectric may be the same insulating layer for the isolation barrier. The transmitter utilizes one structure combining a coil and capacitor plates for transmitting the signal. The receive structure is composed of a coil and differential capacitive plates that are separate and independent. In embodiments, differential receiver circuitry attempts to optimize transceiver efficiency by utilizing both for capacitive and inductive coupling.

In one aspect of the invention, a signal isolator comprises: a first coil having first and second ends; a first plate coupled to the first end of the first coil; a second plate coupled to the second end of the first coil, where the first and/or second plate is configured to be coupled to a drive circuit; a second coil inductively coupled to the first coil; a third plate capacitively coupled to the first plate; a fourth plate capacitively coupled to the second plate; at least one isolation layer between the first and second coils and between the first and second plates and the third and fourth plates; a receive module including a first receive circuit coupled to the third and fourth plates and a second receive circuit to receive a signal on the second coil; and a processing module to generate an output signal corresponding to a signal transmitted by the drive circuit from signals received by the first and second receive circuits.

A signal isolator can further include one or more of the following features: the first and second coils are substantially planar coils, the first plate and second plate correspond to bond pads, the first and/or second plates and the first coil are substantially co-planar, a floating plate between at least the first and third plates, the floating plate is capacitively coupled with the first and third plates, and/or the floating plate distributes charge across the floating plate.

In another aspect, a method for providing a signal isolator comprises: employing a first coil having first and second ends; employing a first plate coupled to the first end of the first coil; employing a second plate coupled to the second end of the first coil, where the first and/or second plate is configured to be coupled to a drive circuit; employing a second coil inductively coupled to the first coil; employing a third plate capacitively coupled to the first plate; employing a fourth plate capacitively coupled to the second plate; employing at least one isolation layer between the first and second coils and between the first and second plates and the third and fourth plates; employing a receive module including a first receive circuit coupled to the third and fourth plates and a second receive circuit to receive a signal on the second coil; and employing a processing module to generate an output signal corresponding to a signal transmitted by the drive circuit from signals received by the first and second receive circuits.

A method can further include one or more of the following features: the first and second coils are substantially planar coils, the first plate and second plate correspond to bond pads, the first and/or second plates and the first coil are substantially co-planar, a floating plate between at least the first and third plates, the floating plate is capacitively coupled with the first and third plates, and/or the floating plate distributes charge across the floating plate.

In a further aspect, a signal isolator comprises: a first coil means; a first plate means for capacitive coupling coupled to the first coil means; a second plate means coupled to the first coil means, where the first and/or second plate means is configured to be coupled to a drive circuit; a second coil means inductively coupled to the first coil means; a third plate means capacitively coupled to the first plate means; a fourth plate means capacitively coupled to the second plate means; at least one isolation layer between the first and second coil means and between the first and second plate means and the third and fourth plate means; a receive means including a first receive circuit coupled to the third and fourth plate means and a second receive circuit to receive a signal on the second coil means; and a processing means to generate an output signal corresponding to a signal transmitted by the drive circuit from signals received by the first and second receive circuits.

A signal isolator can further include one or more of the following features: the first and second coil means are substantially planar coils, the first plate means and second plate means correspond to bond pads, the first and/or second plates means and the first coil are substantially co-planar, a floating plate between at least the first and third plate means, the floating plate is capacitively coupled with the first and third plate means, and/or the floating plate distributes charge across the floating plate.

BRIEF DESCRIPTION OF THE DRAWINGS

The foregoing features of this invention, as well as the invention itself, may be more fully understood from the following description of the drawings in which.

DETAILED DESCRIPTION

Figure 1:
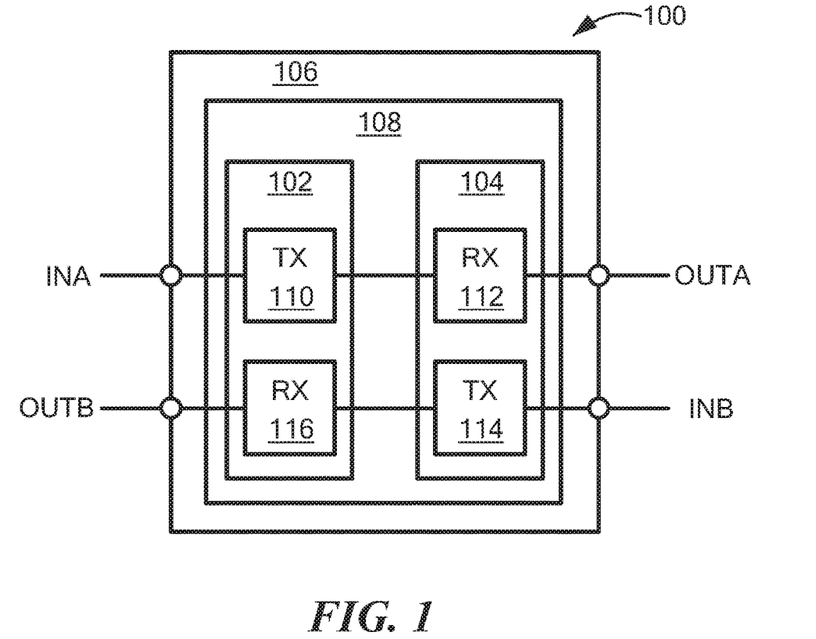
FIG. 1 is a schematic representation of a signal isolator having capacitive and inductive coupling in accordance with example embodiments of the invention.

FIG. 1 shows an example of a signal isolator 100 including first and second dies 102, 104 that form part of an integrated circuit package 106 providing signal isolation using capacitive and inductive signal coupling. In an embodiment, the IC package 106 includes a first input signal INA connected to the first die 102 and a first output signal OUTA connected to the second die 104. The IC package 106 further includes a second input signal INB connected to the second die 104 and a second output signal OUTB to the first die 104. The first and second dies 102, 104 are separated by a barrier region 108, such as an isolation barrier.

In embodiments, the first die 102 includes a first transmit module 110 and the second die includes a first receive module 112 that provides a signal path from the first input signal INA to the first output signal OUTA across the barrier 108. The second die 104 includes a second transmit module 114 and the first die 104 includes a second receive module 116 that provides a signal path from the second input signal INB to the second output signal OUTB across the barrier 108.

As described more fully below, the first and second die 102, 104 communicate via signal paths that include capacitive and inductive coupling. In embodiments, a signal is transmitted and received by a first receiver configured for capacitive signal coupling and by a second receiver configured for inductive coupling.

It is understood that any practical number of transmit, receive, and transmit/receive modules can be formed on the first and/or second die to meet the needs of a particular application. It is further understood that transmit, receive, and transmit/receive modules can comprise the same or different components. In addition, in embodiments, bi-directional communication is provided across the barrier. Further, circuitry in the first and/or second die can provided to process signals, perform routing of signals, and the like. In some embodiments, sensing elements are formed in, on, or about the first and/or second die.

Figure 2:
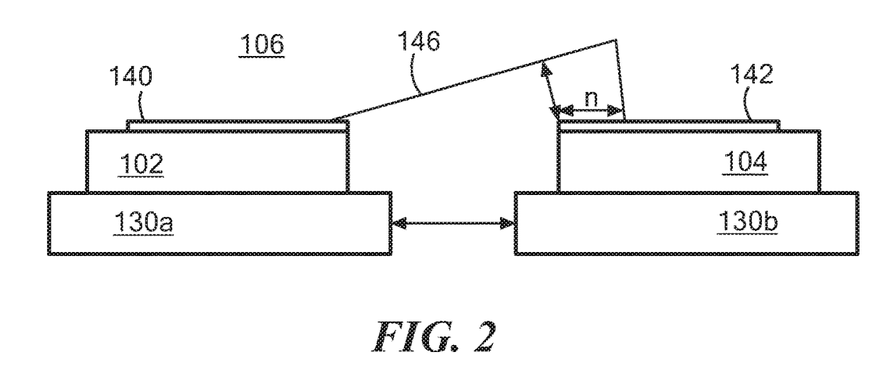
FIG. 2 is a side view of a signal isolator having capacitive and inductive coupling in accordance with example embodiments of the invention.

FIG. 2 shows one particular implementation of an IC 106 having first and second dies 102, 104 on separate leadframe portions 130a,b. Polyimide, SiO2 or other insulating layer(s) 140, 142 for example, can be disposed on the both dies 102, 104 or one die individually. Electrical connections, shown as wirebonds, 146 can connect the first and second dies 102, 104 to form the transmit or receive paths across the barrier. In embodiments, the wirebonds go up and down in opposite directions, as shown. Other electrical connection methods such as flip-chip solder bump or other connection method can be used.

In embodiments, a die can be wire-bonded to terminals of a transmitter. In the illustrated embodiment, the left die 102 is transmitting to the right die 104. In the illustrated embodiment, the wire bond 146 is oriented to achieve a desired spacing between the wire bond and the edge of the die to mitigate breakdown from the wire-bond to the edge of the die.

Figure 3:
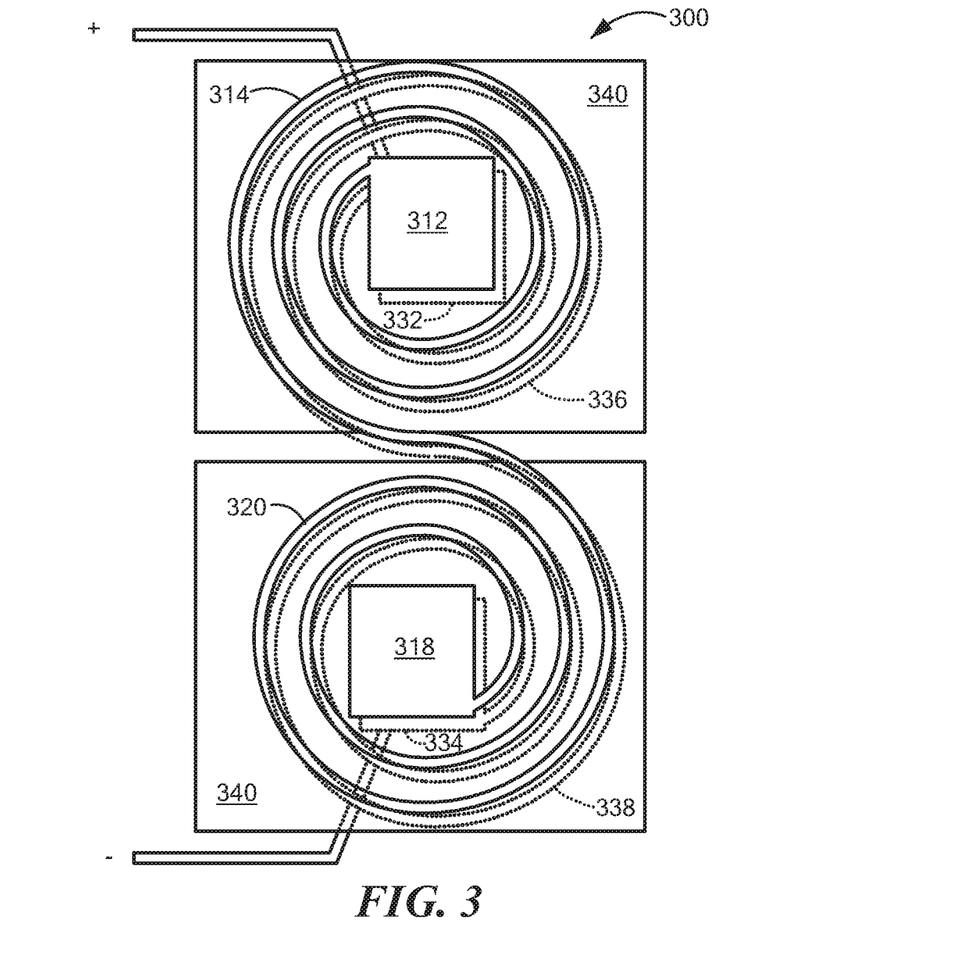
FIG. 3 is a top view of a differential signal isolator structure having capacitive and inductive coupling in accordance with example embodiments of the invention.
Figure 3A:
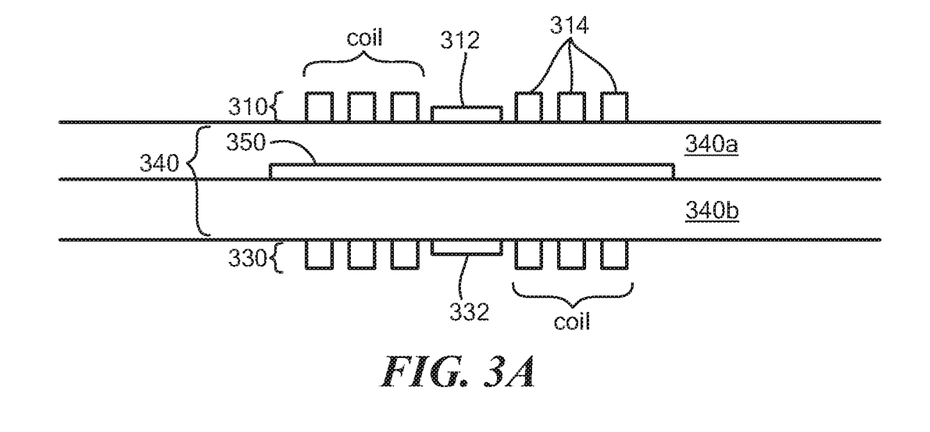
FIG. 3A is a cross-sectional view of the signal isolator of FIG. 3.
Figure 3B:
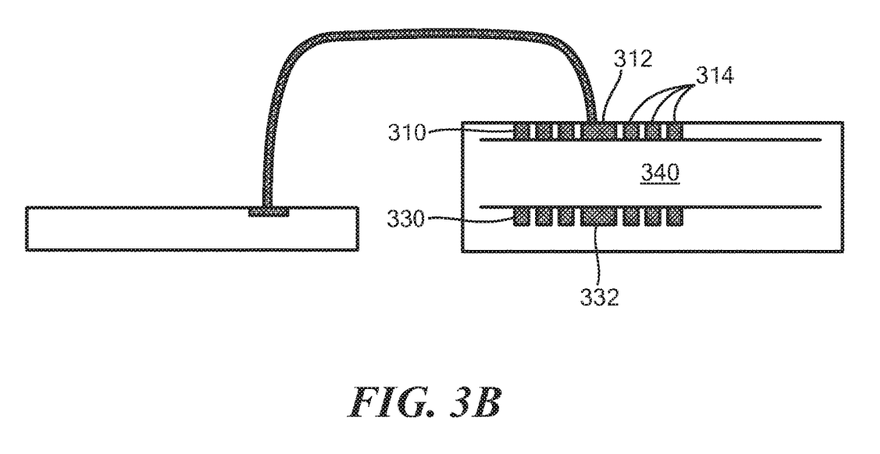
FIG. 3B shows a wirebond connection to a signal isolator having capacitive and inductive coupling in accordance with example embodiments of the invention.

FIG. 3 shows a portion of a signal isolator 300 having first and second voltage domains across which signals can be transmitted and received with a mixed impedance structure. In embodiments, the isolation structure is configured for coupling both magnetic fields and electric fields using capacitive and inductive coupling. FIG. 3A shows a cross sectional view of the isolator portion 100 of FIG. 3 through the first bond pad 312. FIG. 3B shows a wirebond connection to the first bond pad 312 of the first (top) isolator structure 310. Similarly, the second bond pad 318 has a wire bond in the same general configuration as the first bond pad.

A first (top) isolator structure 310 includes a first bond pad 312 around which a top coil 314 is located. In embodiments, the top coil 314 extends from the first bond pad 312 to the second bond pad 318. The top coil 314 is one portion of the magnet coupler, through which transmitter current can flow. In the illustrated embodiment, the top coil 314 forms a part of the transmitter structure. In other embodiments, it is understood that top coil 314 can be the receiver portion of the magnetic coupler. The first (top) isolator structure 310 includes a second bond pad 318 around which a second portion 320 of the top coil is located. The second coil portion 320 extends from the second bond pad 318. In embodiments, the first and second portions 314, 320 of the top coil and are reverse wound.

It is understood that the coils can comprise any practical configuration to meet the needs of a particular applications. Coils can have any number or turns, thickness, width, geometry, shape, such as round, square, polygonal, etc., configured for a particular application. The coil can be replaced by a wire with no turns, with current flow that creates a magnetic field. It is further understood that any practical capacitive structure can be used. In embodiments, a bond pad provides an existing and potentially convenient structure that can provide a capacitive plate. In other embodiments, capacitive plates are positioned to achieve a desired capacitive coupling configuration and may or may not be connected to the transmit coil. On the receiver side the coil and capacitor are independent from each other to achieve optimal coupling.

As can be seen in FIG. 3A, the first bond pad 312 of the first (top) isolator structure 310 is generally aligned with the third bond pad 332 of the second (bottom) isolator structure 330 so as to provide a capacitor. While not shown in FIG. 3A, the second bond pad 318 is aligned with the fourth bond pad 334 so as to provide capacitive coupling with each other. The two capacitive structures can be used single-endly or differentially to transmitter the capacitive portion of the signal. In addition the top coil in the first (top) isolator structure 310 is aligned with the bottom coil in the second (bottom) isolator structure 330. The top and bottom coils are aligned so as to provide inductive coupling with each other. An isolation layer 340 is located between the transmitter structure 310 and receiver structure 330. The transmitter and receiver structures are aligned vertically for optimal coupling. Either transmitter or receiver could be on the top or bottom of the isolation barrier 340. It is also understood that the structure could also be aligned horizontally.

The first and/or second isolation structures 310, 316 can include an optional floating plate 350 across which charge from the drive circuit (not shown) is distributed. It is understood that with the floating plate 350, the isolation layer can include first and second isolation layers 340*a,b* surrounding the floating plate 350.

It is understood that while there may be some degree of capacitive coupling between top and bottom coils, there is negligible inductive coupling of the top and bottom bond pads.

In the example embodiment of FIGS. 3 and 3A, the top isolation structure 310 provides a signal transmitter and the bottom isolation structure 330 provides inductive and capacitive receivers having independent circuits to receive the capacitively coupled signal and the inductively coupled signal. In the example embodiment, the second (bottom) isolation structure 330 is coupled to a driver circuit to provide a transmitter.

Figure 4:
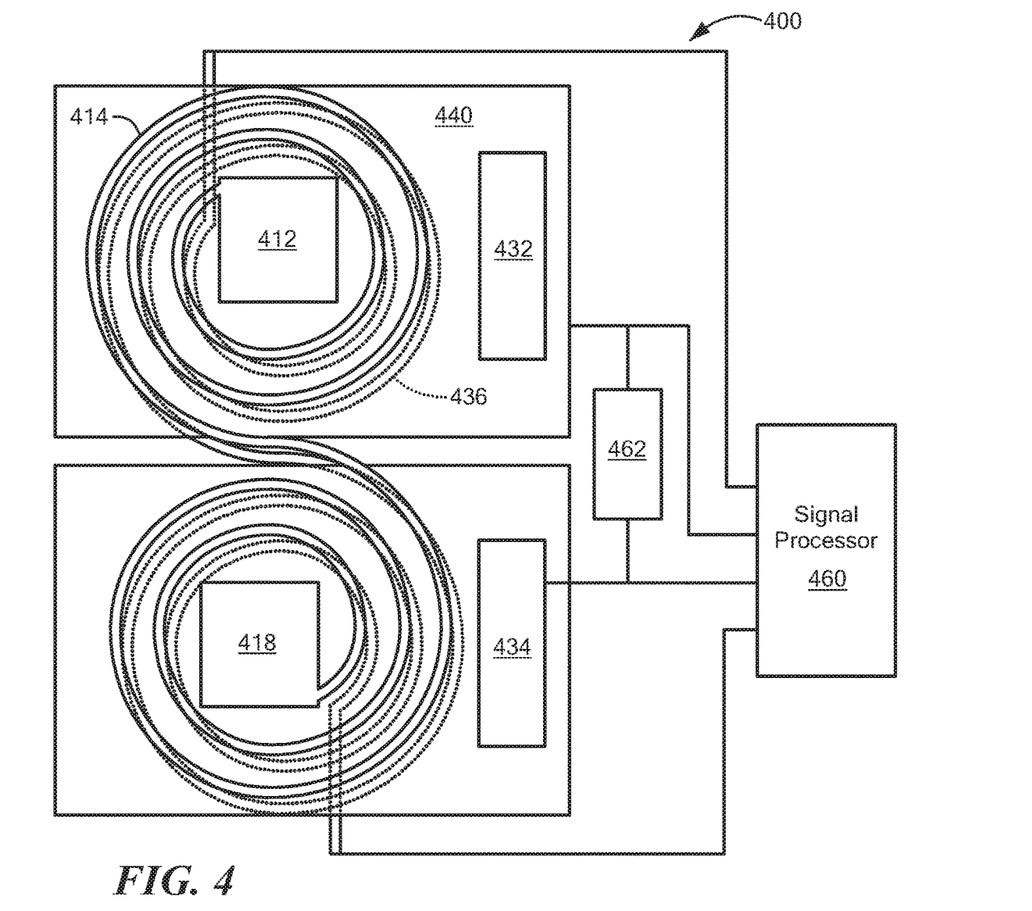
FIG. 4 is a top view of a differential signal isolator structure having capacitive and inductive coupling with offset top and bottom capacitive plates in accordance with example embodiments of the invention.

FIG. 4 shows a signal isolator 400 having isolation structures in which top and bottom capacitive plates do not overlap so that a floating plate provides capacitive coupling. A first (top) isolator structure 410 includes a first bond pad which is a metal plate of the capacitor 412, a second bond pad which is a metal plate of the capacitor 418, and a coil 414 connected to each bond pad. A driver circuit (not shown) can be coupled to the first and second metal plates 412, 418 to provide a differential drive signal.

Figure 4A:
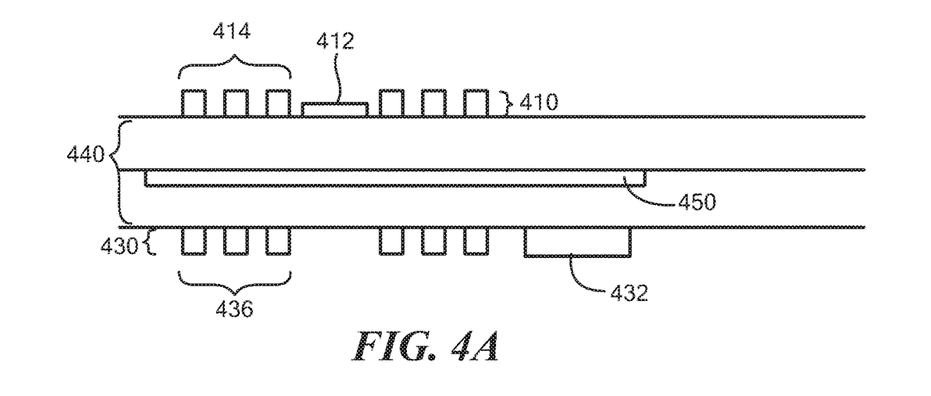
FIG. 4A is a cross-sectional view of the signal isolator of FIG. 4.

A second (bottom) isolator structure 430 includes a third metal plate 432 and a fourth metal plate 434 and a coil 436. In the illustrated embodiment, the third and fourth metal plates 432, 434 are not electrically connected to the coil 436. An isolation layer 440 is located between the first and second isolator structures 410, 430. As shown in FIG. 4A, a floating plate 450 is disposed between the respective top 412, 418 and bottom 432, 434 plates of a differential capacitor. The floating plate 450 distributes charge across its surface which provides capacitive coupling of the offset first 412 and third 432 and second 418 and fourth 434 plates. It is understood that the floating plate 450 should extend to overlap with top and bottom plates. In embodiments, multiple floating plates can be used.

Figure 4B:
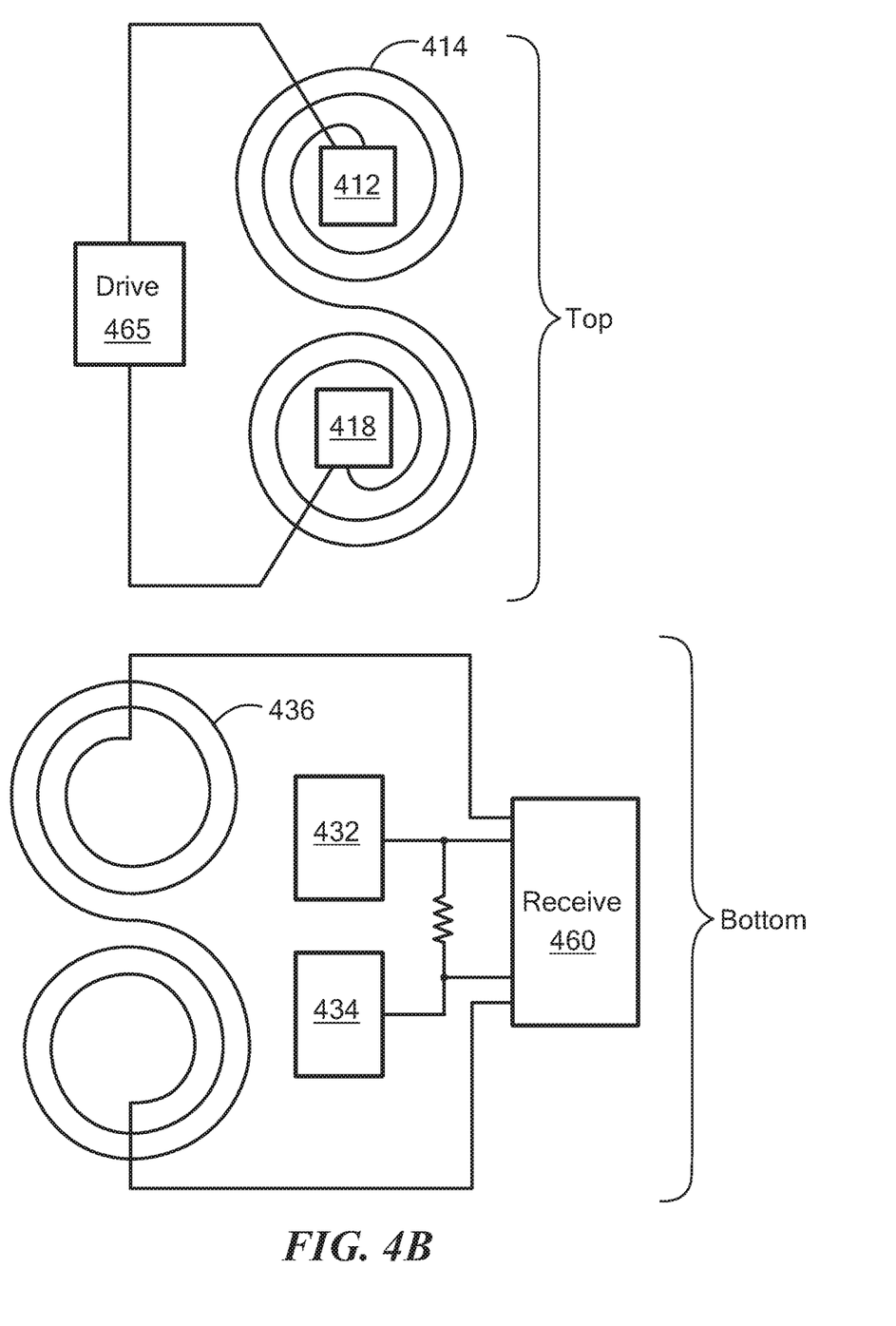
FIG. 4B shows the top and bottom isolator structures of FIG. 4 separately.

In the illustrated embodiment, a signal processing module 460 is coupled to the second (bottom) isolation structure 430 that is not connected to the drive circuit. FIG. 4B shows the drive isolation structure separately from the receive isolation structure for clarity along with a drive circuit 465. A voltage across the third and fourth bond pads 432, 434, across which a sense resistor 462 can be coupled, is provided to the signal processing module 460. In one embodiment, ends of the bottom coil 436 are coupled to the signal processing module 460. In embodiments, a sense coil (not shown) can be used to detect the signal on the coil 436. In other embodiments, magnetic field sensing elements including Hall Effect devices and magnetoresistance devices can be used.

The signal processing module 460 receives a signal corresponding to a differential voltage signal across the two bottom receive plates 432, 434 generated by the drive circuit. The signal processing module 460 also receives a signal corresponding to a current generated by the bottom coil 436. In embodiments, the top coil acts as the transmitter and the bottom coil acts as the receiver for the inductive coupling. The bond pads and, to a lesser extent the coil wires on the top acts as the transmitter for the capacitive coupling. The bottom plates act as receivers for the capacitive coupling. For example, the drive circuit may transmit a logical ONE signal that should be detected by the inductive and capacitive coupling receive circuits for processing by the signal processing module 460.

In embodiments, the signal processing module 460 comprises analog circuitry to process the received inductive and capacitive portion of the transmitted signal. In other embodiments, the signal processing module 460 comprises digital circuitry to process digitized inductive and capacitive portion of the transmitted signals. In each case the inductive and capacitive portions of the signal are combined to recreate the transmitted signal. In embodiments, analog and digital signal processing is provided.

For embodiments that include one or more floating plates, when driven by a differential voltage, the conductive features of the top isolator structure acts to create differential electric fields between the floating plates parallel to the coil and bond pads. Subsequently the floating plates, separated by another insulating material, create a differential electric field between the two bottom parallel plates connected to the receiver. The insulating layers are the dielectric material for the capacitive coupling of the electric fields. The voltage between the bottom plates can be received by any form of receiver circuit optimized for capacitive coupling from the top conductors.

The floating plate can be a continuous sheet of conductor or can be made up of any smaller plates of any geometry electrically connected together, in order to reduce any losses due to eddy currents for drive signals with high frequency content. When a differential voltage is applied to the bond pads as described above, a current will also flow through the conductive coil creating magnetic field. The magnetic field will be coupled to the coil below through the insulating layer(s) through mutual inductance. The induced voltage across the bottom coil can be received by any circuitry suitable to receive an induced magnetic field across a coil. It is understood that the mutual inductive coupling of the coil can be increased by the use of a magnetic field concentrator in the vicinity of the coils, but is not necessary.

In embodiments, drive circuitry can be connected via wirebonds or other conductors from the drive circuitry on a separate integrated circuit. For example the wirebond pads can be configured as square conductive pads shown in the middle of reverse wound coil on top of one of more insulating layers. These conductive structures behave to create a capacitive plate and inductor.

It is understood that the geometry of the bond pads can be selected to meet the needs of a particular application. It is further understood that the coil parameter, e.g., number of turns, width, thickness, length, can be varied to achieve desired characteristics, such as mutual inductance, for a particular application. In addition, it is understood that any suitable insulating material can be used in one or more layers.

Figure 5:
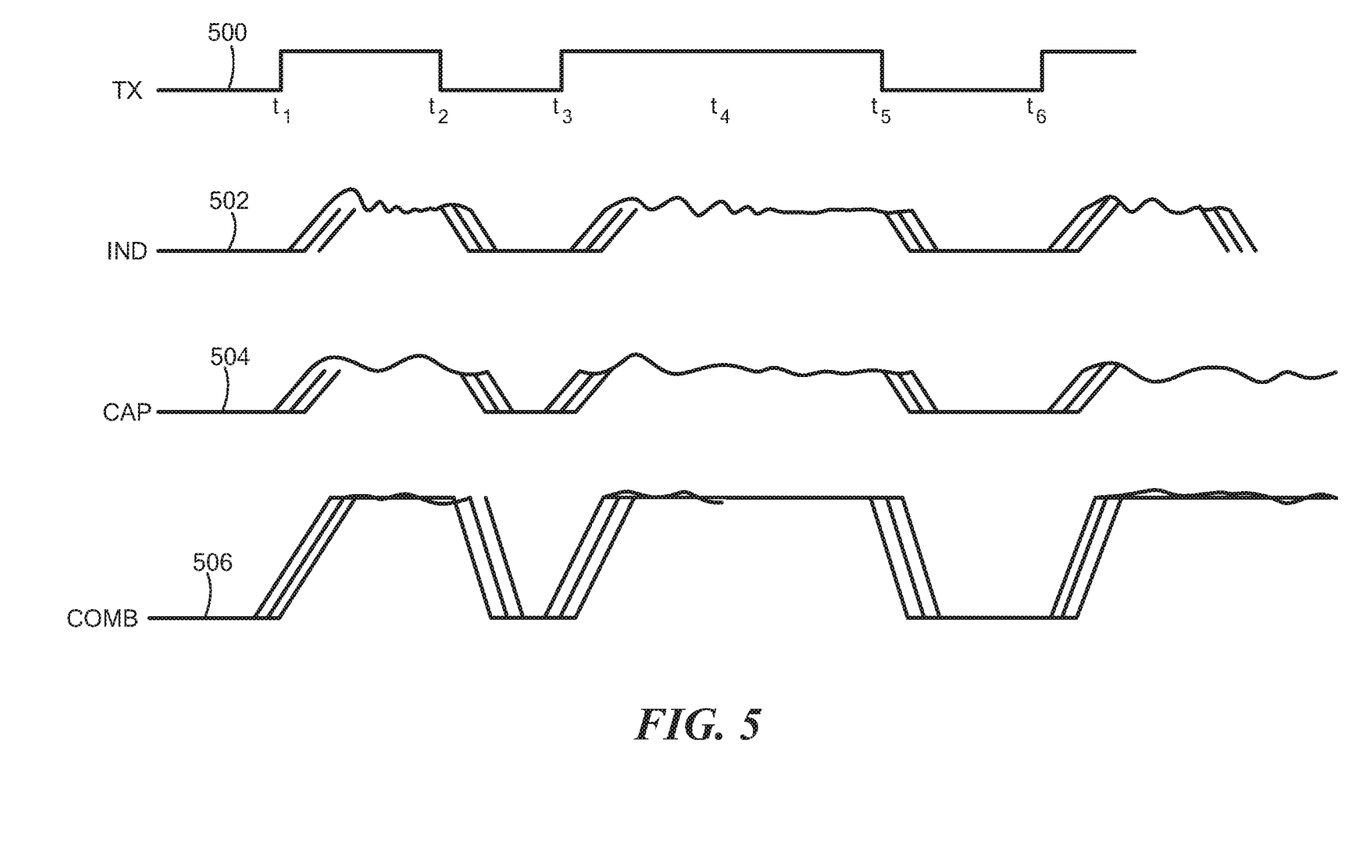
FIG. 5 is a waveform diagram of example signals generated by a signal isolator having capacitive and inductive coupling in accordance with example embodiments of the invention.

FIG. 5 shows example representative signals for a transmit signal 500, an inductively coupled portion of the signal 502, and a capacitively coupled portion of the signal. For example, inductively coupled signal 502 can correspond to a signal on the coil 436 of FIG. 4 and capacitively coupled signal 504 can correspond to a voltage across the bond pads 432, 434 of FIG. 4. The inductively coupled signal 502 and the capacitively coupled signal 504 can be combined 506. It is understood that the waveforms can be of any practical shape and characteristics.

In the illustrated embodiment, a logical ONE is transmitted at time t1. For example, drive circuit 465 of FIG. 4B can transition its output from a ZERO to a ONE. After some propagation time, the transmitted ONE signal will be seen on the inductively coupled signal 502 and the capacitively coupled signal 504. It is understood that the received signals 502, 504 will be attenuated by a respective factor. When combined the capacitively and inductively coupled portions of the signal will be combined in such a way to minimize that attenuation. The combined signal can be used to generate an output equal to the input logical ONE.

It is understood that for inductive coupling using the coil a high impedance resistance is preferred while for capacitive coupling using a bond pad/capacitor a low impedance resistance is preferred. By utilizing independent receive circuits to detect the capacitively coupled signal and the inductively coupled signal, each of the receive circuits can be optimized for the respective input signal. The capacitive-coupled and inductive-coupled signals can be processed and combined to recover the information transmitted by the drive signal.

Figure 6:
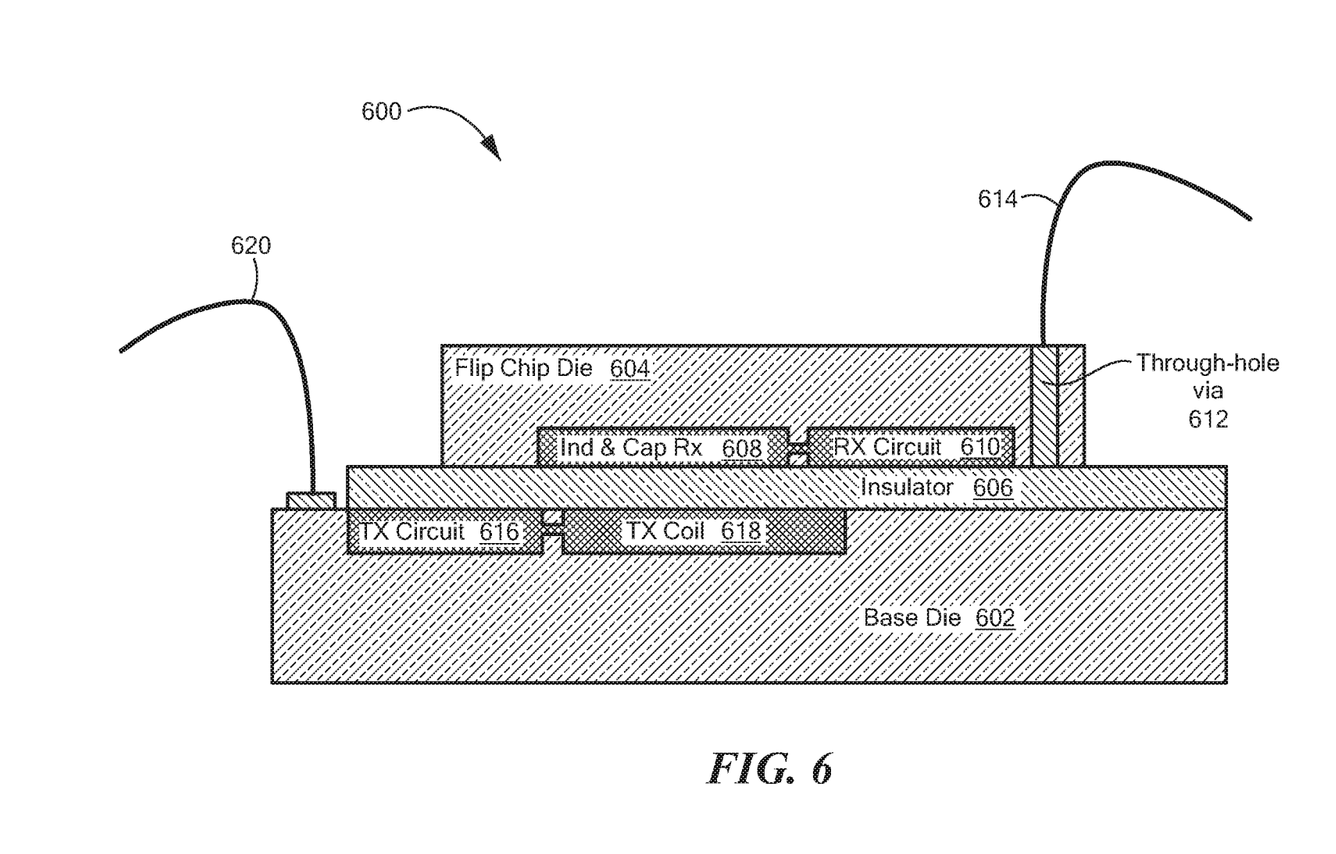
FIG. 6 is a schematic representation of a signal isolator having capacitive and inductive coupling in a flip chip configuration in accordance with example embodiments of the invention.

FIG. 6 shows an example isolator 600 having a flip configuration having a base die 602 supporting a flip chip die 604 with an insulator layer 606. A receive module 608 includes inductive and capacitive signal coupling, as described above, coupled to a receive circuit 610. An external connection to the receive circuit 610 can be provided by a via 612 and wirebond 614. A transmit circuit 616 includes inductive and capacitive signal coupling, as described above, coupled to a transmit circuit 618. An external connection to the transmit circuit 616 can be provided by a wirebond 620. In embodiments, the receive and/or transmit circuitry can be located on the top or bottom. In some embodiments, both receive and transmit circuitry for different channels can be on multiple die. In general, in embodiments, the receiver and transmitter may be located on separate chips which are stacked.

Figure 7:
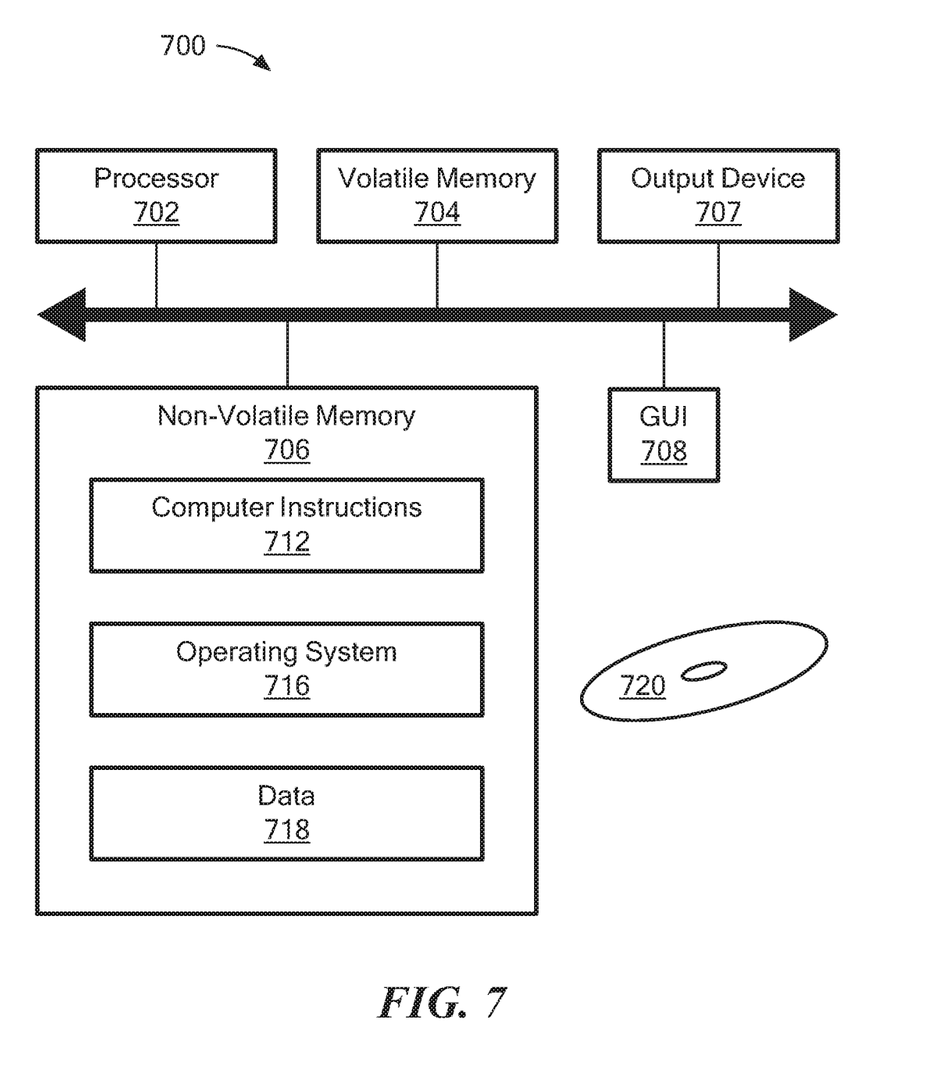
FIG. 7 is a schematic representation of an example computer that may perform at least a portion of the processing described herein.

FIG. 7 shows an exemplary computer 700 that can perform at least part of the processing described herein. The computer 700 includes a processor 702, a volatile memory 704, a non-volatile memory 706 (e.g., hard disk), an output device 707 and a graphical user interface (GUI) 708 (e.g., a mouse, a keyboard, a display, for example). The non-volatile memory 706 stores computer instructions 712, an operating system 716 and data 718. In one example, the computer instructions 712 are executed by the processor 702 out of volatile memory 704. In one embodiment, an article 720 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A signal isolator, comprising:
    a first coil having first and second ends;
    a first plate coupled to the first end of the first coil;
    a second plate coupled to the second end of the first coil, where the first and/or second plate is configured to be coupled to a drive circuit;
    a second coil inductively coupled to the first coil;
    a third plate capacitively coupled to the first plate;
    a fourth plate capacitively coupled to the second plate;
    at least one isolation layer between the first and second coils and between the first and second plates and the third and fourth plates;
    a receive module including a first receive circuit coupled to the third and fourth plates and a second receive circuit to receive a signal on the second coil; and
    a processing module to generate an output signal corresponding to a signal transmitted by the drive circuit from signals received by the first and second receive circuits.

2. The signal isolator according to claim 1, wherein the first and second coils are substantially planar coils.

3. The signal isolator according to claim 1, wherein the first plate and second plate corresponds to bond pads.

4. The signal isolator according to claim 1, wherein the first and/or second plates and the first coil are substantially co-planar.

5. The signal isolator according to claim 1, further including a floating plate between at least the first and third plates.

6. The signal isolator according to claim 5, wherein the floating plate is capacitively coupled with the first and third plates.

7. The signal isolator according to claim 5, wherein the floating plate distributes charge across the floating plate.

8. A method for providing a signal isolator, comprising:
    employing a first coil having first and second ends;
    employing a first plate coupled to the first end of the first coil;
    employing a second plate coupled to the second end of the first coil, where the first and/or second plate is configured to be coupled to a drive circuit;
    employing a second coil inductively coupled to the first coil;
    employing a third plate capacitively coupled to the first plate;
    employing a fourth plate capacitively coupled to the second plate;
    employing at least one isolation layer between the first and second coils and between the first and second plates and the third and fourth plates;
    employing a receive module including a first receive circuit coupled to the third and fourth plates and a second receive circuit to receive a signal on the second coil; and
    employing a processing module to generate an output signal corresponding to a signal transmitted by the drive circuit from signals received by the first and second receive circuits.

9. The method according to claim 8, wherein the first and second coils are substantially planar coils.

10. The method according to claim 8, wherein the first plate and second plate correspond to bond pads.

11. The method according to claim 8, wherein the first and/or second plates and the first coil are substantially co-planar.

12. The method according to claim 8, further including a floating plate between at least the first and third plates.

13. The method according to claim 12, wherein the floating plate is capacitively coupled with the first and third plates.

14. The method according to claim 12, wherein the floating plate distributes charge across the floating plate.

15. A signal isolator, comprising:
 a first coil means;
 a first plate means for capacitive coupling coupled to the first coil means;
 a second plate means coupled to the first coil means, where the first and/or second plate means is configured to be coupled to a drive circuit;
 a second coil means inductively coupled to the first coil means;
 a third plate means capacitively coupled to the first plate means;
 a fourth plate means capacitively coupled to the second plate means;
 at least one isolation layer between the first and second coil means and between the first and second plate means and the third and fourth plate means;
 a receive means including a first receive circuit coupled to the third and fourth plate means and a second receive circuit to receive a signal on the second coil means; and
 a processing means to generate an output signal corresponding to a signal transmitted by the drive circuit from signals received by the first and second receive circuits.

16. The signal isolator according to claim 15, wherein the first and second coil means are substantially planar coils.

17. The signal isolator according to claim 15, wherein the first plate means and second plate means correspond to bond pads.

18. The signal isolator according to claim 15, wherein the first and/or second plates means and the first coil are substantially co-planar.

19. The signal isolator according to claim 1, further including a floating plate between at least the first and third plate means.

20. The signal isolator according to claim 19, wherein the floating plate is capacitively coupled with the first and third plate means.

21. The signal isolator according to claim 19, wherein the floating plate distributes charge across the floating plate.

* * * * *